US010647950B2

(12) United States Patent
Inaoka et al.

(10) Patent No.: US 10,647,950 B2
(45) Date of Patent: May 12, 2020

(54) CLEANING FORMULATIONS

(71) Applicant: VERSUM MATERIALS US, LLC, Tempe, AZ (US)

(72) Inventors: Seiji Inaoka, Macungie, PA (US); William Jack Casteel, Jr., Fountain Hill, PA (US); Wen Dar Liu, Chupei (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 21 days.

(21) Appl. No.: 15/562,840

(22) PCT Filed: Mar. 31, 2016

(86) PCT No.: PCT/US2016/025186
§ 371 (c)(1),
(2) Date: Sep. 28, 2017

(87) PCT Pub. No.: WO2016/161072
PCT Pub. Date: Oct. 6, 2016

(65) Prior Publication Data
US 2018/0105774 A1 Apr. 19, 2018

Related U.S. Application Data

(60) Provisional application No. 62/140,751, filed on Mar. 31, 2015.

(51) Int. Cl.
*C11D 7/50* (2006.01)
*C11D 11/00* (2006.01)
(Continued)

(52) U.S. Cl.
CPC ........ *C11D 11/0047* (2013.01); *C11D 3/0073* (2013.01); *C11D 7/08* (2013.01);
(Continued)

(58) Field of Classification Search
CPC .................................................. C11D 11/0047
(Continued)

(56) References Cited

U.S. PATENT DOCUMENTS 5,417,877 A 5/1995 Ward
6,755,989 B2 6/2004 Wojtczak et al.
(Continued)

FOREIGN PATENT DOCUMENTS

JP 2013101224 A2 5/2013
WO 2008157345 A2 12/2008

OTHER PUBLICATIONS

International Search Report and Written Opinion for counterpart international patent application No. PCT/US2016/025186 dated Jul. 25, 2016 by the Korean Intellectual Property Office in its capacity as International Searching Authority.

*Primary Examiner* — Gregory E Webb
(74) *Attorney, Agent, or Firm* — Anne B. Kiernan

(57) ABSTRACT

A composition and method for removing copper-containing post-etch and/or post-ash residue from patterned microelectronic devices is described. The removal composition includes water, a fluoride ion source, an alkanolamine, sulfuric acid, and an organic acid. The compositions effectively remove the copper and cobalt-containing post-etch residue from the microelectronic device without damaging exposed low-k dielectric and metal interconnect materials.

21 Claims, 2 Drawing Sheets

| Components (in grams) | Example ID Number | | | | | | | | | | |
|---|---|---|---|---|---|---|---|---|---|---|---|
| | 44R | 63A | 63B | 63C | 63D | 63E | 63F | 63G | 63H | 63i | 63J |
| DIW | 15.00 | 18.40 | 18.00 | 15.80 | 15.70 | 12.80 | 13.20 | 23.00 | 23.60 | 18.70 | 19.40 |
| PG | 40.00 | 40.00 | 40.00 | 40.00 | 40.00 | 40.00 | 40.00 | 40.00 | 40.00 | 40.00 | 40.00 |
| L-ascorbic acid | 1.00 | 1.00 | 1.00 | 1.00 | 1.00 | 2.00 | 2.00 | 2.00 | 2.00 | 2.00 | 2.00 |
| Citric acid (27.5%) | 2.00 | 2.00 | 2.00 | 2.00 | 2.00 | | | | | | |
| TEA | 25.00 | 25.00 | 25.00 | 25.00 | 25.00 | 28.00 | 28.00 | 28.00 | 28.00 | 20.00 | 20.00 |
| HF (5%) | 17.00 | 13.20 | 13.00 | 15.90 | 16.20 | 15.00 | 15.00 | 3.00 | 3.00 | 15.00 | 15.00 |
| HCl (35%) | | | 1.00 | 0.30 | | | | | | | |
| H2SO4 (98%) | | 0.40 | | | 0.10 | | 1.80 | | 3.40 | | 3.60 |
| acetic acid | | | | | | 2.20 | | 4.00 | | 4.30 | |
| Tolyltriazole | | | | | | | | | | | |
| 5% pH of formulation | 8.0 | 7.9 | 7.9 | 8.0 | 8.0 | 7.8 | 7.9 | 7.9 | 7.9 | 6.9 | 6.9 |
| Co Etch Rate [A/min] | 4.21 | 1.54 | 1.72 | 1.75 | 2.71 | 2.48 | 2.04 | 0.51 | 2.34 | 3.84 | 4.29 |
| Cu Etch Rate [A/min] | 1.60 | 1.18 | 0.72 | 1.17 | 0.95 | 1.05 | 0.90 | 0.85 | 0.62 | 0.55 | 0.70 |

| Components (in grams) | Example ID Number | | | | | | | | | | |
|---|---|---|---|---|---|---|---|---|---|---|---|
| | 63K | 63L | 63M | 63N | 63O | 63P | 63Q | 63R | 67A | 67C | 67O |
| DIW | 26.80 | 27.80 | 31.00 | 19.74 | 20.42 | 27.63 | 28.61 | 31.72 | 8.72 | 47.72 | 52.95 |
| PG | 40.00 | 40.00 | 40.00 | 39.00 | 39.00 | 39.00 | 39.00 | 39.00 | 39.00 | | |
| L-ascorbic acid | 2.00 | 2.00 | 2.00 | 1.95 | 1.95 | 1.95 | 1.95 | 1.95 | 1.00 | 1.00 | 0.90 |
| Citric acid (27.5%) | | | | | | | | | | | |
| TEA | 20.00 | 20.00 | 20.00 | 20.50 | 20.50 | 20.50 | 20.50 | 20.50 | 30.00 | 30.00 | 27.00 |
| HF (5%) | 5.00 | 5.00 | | 14.63 | 14.63 | 4.88 | 4.88 | | 14.63 | 14.63 | 13.17 |
| HCl (35%) | | | | | | | | | | | |
| H2SO4 (98%) | | 5.20 | | | 3.51 | | 5.07 | | 6.55 | 6.55 | 5.90 |
| acetic acid | 6.20 | | 7.00 | 4.19 | | 6.05 | | 6.83 | | | |
| Tolyltriazole | | | | | | | | | 0.10 | 0.10 | 0.09 |
| 5% pH of formulation | 6.6 | 6.6 | 6.5 | 7.1 | 7.2 | 6.9 | 7.0 | 6.9 | 7.2 | 7.1 | 7.4 |
| Co Etch Rate [A/min] | 2.70 | 1.42 | 1.84 | 4.07 | 5.09 | 3.48 | 3.87 | 0.38 | 0.02 | 0.07 | 0.30 |
| Cu Etch Rate [A/min] | 0.80 | 0.76 | 0.75 | 0.68 | 0.87 | 1.07 | 1.08 | 0.77 | 9.33 | 3.77 | 1.10 |

(51) Int. Cl.
*C11D 3/00* (2006.01)
*C11D 7/08* (2006.01)
*C11D 7/10* (2006.01)
*C11D 7/26* (2006.01)
*C11D 7/32* (2006.01)
*H01L 21/02* (2006.01)
*H01L 21/311* (2006.01)
*G03F 7/42* (2006.01)

(52) U.S. Cl.
CPC .............. *C11D 7/10* (2013.01); *C11D 7/261* (2013.01); *C11D 7/265* (2013.01); *C11D 7/3209* (2013.01); *C11D 7/3218* (2013.01); *C11D 7/3263* (2013.01); *C11D 7/5022* (2013.01); *G03F 7/423* (2013.01); *G03F 7/425* (2013.01); *G03F 7/426* (2013.01); *H01L 21/02074* (2013.01); *H01L 21/31133* (2013.01)

(58) Field of Classification Search
USPC ................................................ 510/175, 176
See application file for complete search history.

(56) References Cited

U.S. PATENT DOCUMENTS

| | | | |
|---|---|---|---|
| 7,250,391 B2 | 7/2007 | Kanno et al. | |
| 7,399,365 B2 | 7/2008 | Aoyama et al. | |
| 7,723,280 B2 | 5/2010 | Brainard et al. | |
| 8,030,263 B2 * | 10/2011 | Egbe | C11D 7/10 134/1.3 |
| 2003/0181342 A1 | 9/2003 | Seijo et al. | |
| 2004/0038840 A1 * | 2/2004 | Lee | C11D 3/0073 510/202 |
| 2005/0014667 A1 * | 1/2005 | Aoyama | C11D 7/08 510/175 |
| 2006/0016785 A1 | 1/2006 | Egbe et al. | |
| 2006/0040838 A1 | 2/2006 | Shimada et al. | |
| 2006/0178282 A1 | 8/2006 | Suyama et al. | |
| 2006/0237392 A1 | 10/2006 | Auger et al. | |
| 2006/0270573 A1 | 11/2006 | Ikemoto et al. | |
| 2006/0293208 A1 * | 12/2006 | Egbe | C11D 7/3263 510/407 |
| 2007/0078073 A1 | 4/2007 | Auger | |
| 2008/0169004 A1 | 7/2008 | Wu | |
| 2009/0131295 A1 * | 5/2009 | Cui | H01L 21/02063 510/176 |
| 2009/0192065 A1 | 7/2009 | Korzenski et al. | |
| 2009/0301996 A1 | 12/2009 | Visintin et al. | |
| 2010/0043823 A1 * | 2/2010 | Lee | C11D 7/3263 134/1.3 |
| 2010/0105595 A1 | 4/2010 | Lee | |
| 2013/0217234 A1 * | 8/2013 | Liu | C11D 7/34 438/702 |
| 2014/0109931 A1 * | 4/2014 | Lee | C11D 7/10 134/3 |
| 2017/0081622 A1 * | 3/2017 | Inaoka | H01L 21/02068 |

* cited by examiner

| Components (in grams) | 44R | 63A | 63B | 63C | 63D | 63E | 63F | 63G | 63H | 63i | 63J |
|---|---|---|---|---|---|---|---|---|---|---|---|
| DIW | 15.00 | 18.40 | 18.00 | 15.80 | 15.70 | 12.80 | 13.20 | 23.00 | 23.60 | 18.70 | 19.40 |
| PG | 40.00 | 40.00 | 40.00 | 40.00 | 40.00 | 40.00 | 40.00 | 40.00 | 40.00 | 40.00 | 40.00 |
| L-ascorbic acid | 1.00 | 1.00 | 1.00 | 1.00 | 1.00 | 2.00 | 2.00 | 2.00 | 2.00 | 2.00 | 2.00 |
| Citric acid (27.5%) | 2.00 | 2.00 | 2.00 | 2.00 | 2.00 | | | | | | |
| TEA | 25.00 | 25.00 | 25.00 | 25.00 | 25.00 | 28.00 | 28.00 | 28.00 | 28.00 | 20.00 | 20.00 |
| HF (5%) | 17.00 | 13.20 | 13.00 | 15.90 | 16.20 | 15.00 | 15.00 | 3.00 | 3.00 | 15.00 | 15.00 |
| HCl (35%) | | | 1.00 | 0.30 | | | | | | | |
| H$_2$SO$_4$ (98%) | | 0.40 | | | 0.10 | | 1.80 | | 3.40 | | 3.60 |
| acetic acid | | | | | | 2.20 | | 4.00 | | 4.30 | |
| Tolyltriazole | | | | | | | | | | | |
| 5% pH of formulation | 8.0 | 7.9 | 7.9 | 8.0 | 8.0 | 7.8 | 7.9 | 7.9 | 7.9 | 6.9 | 6.9 |
| Co Etch Rate [A/min] | 4.21 | 1.54 | 1.72 | 1.75 | 2.71 | 2.48 | 2.04 | 0.51 | 2.34 | 3.84 | 4.29 |
| Cu Etch Rate [A/min] | 1.60 | 1.18 | 0.72 | 1.17 | 0.95 | 1.05 | 0.90 | 0.85 | 0.62 | 0.55 | 0.70 |

Example ID Number

FIGURE 1A

| Components (in grams) | 63K | 63L | 63M | 63N | 63O | 63P | 63Q | 63R | 67A | 67C | 67O |
|---|---|---|---|---|---|---|---|---|---|---|---|
| DIW | 26.80 | 27.80 | 31.00 | 19.74 | 20.42 | 27.63 | 28.61 | 31.72 | 8.72 | 47.72 | 52.95 |
| PG | 40.00 | 40.00 | 40.00 | 39.00 | 39.00 | 39.00 | 39.00 | 39.00 | 39.00 | | |
| L-ascorbic acid | 2.00 | 2.00 | 2.00 | 1.95 | 1.95 | 1.95 | 1.95 | 1.95 | 1.00 | 1.00 | 0.90 |
| Citric acid (27.5%) | | | | | | | | | | | |
| TEA | 20.00 | 20.00 | 20.00 | 20.50 | 20.50 | 20.50 | 20.50 | 20.50 | 30.00 | 30.00 | 27.00 |
| HF (5%) | 5.00 | 5.00 | | 14.63 | 14.63 | 4.88 | 4.88 | | 14.63 | 14.63 | 13.17 |
| HCl (35%) | | | | | | | | | | | |
| H2SO4 (98%) | | 5.20 | | | 3.51 | | 5.07 | | 6.55 | 6.55 | 5.90 |
| acetic acid | 6.20 | | 7.00 | 4.19 | | 6.05 | | 6.83 | | | |
| Tolyltriazole | | | | | | | | | 0.10 | 0.10 | 0.09 |
| 5% pH of formulation | 6.6 | 6.6 | 6.5 | 7.1 | 7.2 | 6.9 | 7.0 | 6.9 | 7.2 | 7.1 | 7.4 |
| Co Etch Rate [A/min] | 2.70 | 1.42 | 1.84 | 4.07 | 5.09 | 3.48 | 3.87 | 0.38 | 0.02 | 0.07 | 0.30 |
| Cu Etch Rate [A/min] | 0.80 | 0.76 | 0.75 | 0.68 | 0.87 | 1.07 | 1.08 | 0.77 | 9.33 | 3.77 | 1.10 |

FIGURE 1B

CLEANING FORMULATIONS

CROSS REFERENCE TO RELATED APPLICATIONS

This application is a U.S. National Phase filing of international patent application number PCT/US2016/025186 filed Mar. 31, 2016 that claims the benefit of U.S. Provisional Application No. 62/140,751, filed Mar. 31, 2015. The disclosures of these applications are hereby incorporated by reference in their entirety.

BACKGROUND

The present invention relates to cleaning compositions that can be used for a variety of applications including, for example, removing unwanted resist films, post-etch, and post-ash residue on a semiconductor substrate. In particular, the present invention relates to cleaning compositions useful for the removal of residue, preferably copper-containing post-etch and/or post-ash residue, from the surface of substrates, preferably microelectronic devices, and methods of using said compositions for removal of same.

The background of the present invention will be described in connection with its use in cleaning applications involving the manufacture of integrated circuits. It should be understood, however, that the use of the present invention has wider applicability as described hereinafter.

In the manufacture of integrated circuits, it is sometimes necessary to etch openings or other geometries in a thin film deposited or grown on the surface of silicon, gallium arsenide, glass, or other substrate located on an in-process integrated circuit wafer. Present methods for etching such a film require that the film be exposed to a chemical etching agent to remove portions of the film. The particular etching agent used to remove the portions of the film depends upon the nature of the film. In the case of an oxide film, for example, the etching agent may be hydrofluoric acid. In the case of a polysilicon film, it will typically be hydrofluoric acid or a mixture of nitric acid and acetic acid.

In order to assure that only desired portions of the film are removed, a photolithography process is used, through which a pattern in a computer drafted photo mask is transferred to the surface of the film. The mask serves to identify the areas of the film which are to be selectively removed. This pattern is formed with a photoresist material, which is a light sensitive material spun onto the in-process integrated circuit wafer in a thin film and exposed to high intensity radiation projected through the photo mask. The exposed or unexposed photoresist material, depending on its composition, is typically dissolved with developers, leaving a pattern which allows etching to take place in the selected areas, while preventing etching in other areas. Positive-type resists, for example, have been extensively used as masking materials to delineate patterns on a substrate that, when etching occurs, will become vias, trenches, contact holes, etc.

Increasingly, a dry etching process such as, for example, plasma etching, reactive ion etching, or ion milling is used to attack the photoresist-unprotected area of the substrate to form the vias, trenches, contact holes, etc. As a result of the plasma etching process, photoresist, etching gas and etched material by-products are deposited as residues around or on the sidewall of the etched openings on the substrate.

Such dry etching processes also typically render the resist mask extremely difficult to remove. For example, in complex semiconductor devices such as advanced DRAMS and logic devices with multiple layers of back end lines of interconnect wiring, reactive ion etching (RIE) is used to produce vias through the interlayer dielectric to provide contact between one level of silicon, silicide or metal wiring to the next level of wiring. These vias typically expose, Al, AlCu, Cu, Ti, TiN, Ta, TaN, silicon or a silicide such as, for example, a silicide of tungsten, titanium or cobalt. The RIE process, for example, leaves a residue on the involved substrate comprising a complex mixture that may include, for example, re-sputtered oxide material, polymeric material derived from the etch gas, and organic material from the resist used to delineate the vias.

Additionally, following the termination of the etching step, the photoresist and etch residues must be removed from the protected area of the wafer so that the final finishing operation can take place. This can be accomplished in a plasma "ashing" step by the use of suitable plasma ashing gases. This typically occurs at high temperatures, for example, above 200 degrees C. Ashing converts most of the organic residues to volatile species, but leaves behind on the substrate a predominantly inorganic residue. Such residue typically remains not only on the surface of the substrate, but also on the inside walls of vias that may be present. As a result, ash-treated substrates are often treated with a cleaning composition typically referred to as a "liquid stripping composition" to remove the highly adherent residue from the substrate. Finding a suitable cleaning composition for removal of this residue without adversely affecting, e.g., corroding, dissolving or dulling, the metal circuitry has also proven problematic. Failure to completely remove or neutralize the residue can result in discontinuances in the circuitry wiring and undesirable increases in electrical resistance.

Cleaning of post-etch residues remains a critical process step for any low-k dielectric material to succeed. As the dielectric constant of the low-k material pushes below 2.4, the chemical and mechanical sensitivity increases (e.g., chemical strength decreases, etc.), thereby requiring shorter process times and/or less aggressive chemistries. Unfortunately, shorter process times generally translates to more aggressive chemistries which can have a detrimental effect on the low-k dielectric material, as well as other stack materials (e.g., copper, etch stop, etc.).

Also, new uses for various metals are being developed that create challenges for removing their residues. One such example is the use of cobalt as an insulation of diffusion barrier layer layer to prevent the migration of copper into a wafer or dielectric layer. Cobalt-containing post-etch residue is very difficult to remove from, for example, via walls. Thus, improved cleaning chemistries with very high selectivity are desired.

Prior art stripping compositions include, for example: U.S. Pat. No. 7,399,356 (Aoyama), U.S. Pat. No. 6,755,989 (Wojtczak), U.S. Pat. No. 7,250,391 (Kanno), U.S. Pat. No. 7,723,280 (Brainard), U.S. patent application Publication No. 2006/0016785 (Egbe); U.S. patent application Publication No. 2006/0178282 (Suyama), U.S. patent application Publication No. 2006/0237392 (Auger), U.S. patent application Publication No. 2006/0270573 (Ikemoto), U.S. patent application Publication No. 2007/0078073 (Auger), and U.S. patent application Publication No. 2009/0301996 (Visintin). Such prior art stripping compositions for removing the etching residue suffer, however, from significant drawbacks. For example, their use tends to erode copper wire exposed on the bottoms of via holes. Moreover, where porous interlayer low-k dielectrics are concerned, prior art stripping compositions either etch the porous interlayer dielectric materials or include components that adsorb into the pores thus increasing the dilectric constant, k, of the dielectric materials, which may potentially negatively impact the performance of the ultimate device.

Therefore, there is a need in the art for a cleaning composition for back end of the line cleaning operations that effectively cleans substrates comprising porous interlayer dielectric layers, but does not significantly etch metals (e.g., Cu, Al) or the porous low-k dielectrics, and that does not significantly negatively impact the dielectric constant of the porous low-k films.

BRIEF DESCRIPTION OF THE DRAWINGS

Embodiments of the present invention will hereinafter be described in conjunction with the appended drawing figures wherein like numerals denote like elements.

FIG. 1A is a table of the components of compositions tested, the mass of each component, and the film loss rate for a first group of examples of the present invention; and FIG. 1B is a table of the components of compositions tested, the mass of each component, and the film loss rate for a second group of examples of the present invention.

SUMMARY

The present invention satisfies this need by providing a composition useful for removing residue from a semiconductor substrate, the composition comprising: a) from about 25% to about 80% by weight of water; b) from about 0.01% to about 5% by weight of a source of fluoride ions, based on actives; c) from about 0.01% to about 10% by weight of sulfuric acid; d) from about 1% to about 50% by weight of an alkanolamine; e) from about 1% to about 25% by weight of an organic acid, wherein the pH of the composition is from 7 to 9.

In another aspect, a composition useful for removing residue from a semiconductor substrate is provided, the composition comprising: from about 25% to about 80% by weight of water; from about 0.01% to about 5% by weight of a fluoride ion source, based on actives; from about 0.01% to about 10% by weight of sulfuric acid; from about 1% to about 50% by weight of an alkanolamine; from about 1% to about 25% by weight of an organic acid, wherein the pH of the composition is from 7 to 9.

In another aspect, a composition is provided comprising: from about 50% to about 80% by weight of water; from about 9.5% to about 15% by weight of a source of fluoride ions, based on actives; from about 2.0% to about 8% by weight of sulfuric acid; from about 25% to about 30% by weight of an alkanolamine; from about 0.8% to about 2.0% by weight of an organic acid, wherein the pH of the composition is from 7 to 9.

In yet another aspect, a composition is provided comprising: from about 50% to about 80% by weight of water; from about 20% to about 30% by weight of at least one alkanolamine; from about 5% to about 15% by weight of HF; from about 0.5% to about 2% by weight of L-ascorbic acid; and from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the pH of the composition is from 7 to 9.

In still yet another aspect, a composition is provided comprising: from about 50% to about 80% by weight of water; from about 9.5% to about 15% by weight of a source of fluoride ions, based on actives; from about 2.0% to about 8% by weight of sulfuric acid; from about 25% to about 30% by weight of an alkanolamine; from about 0.8% to about 2.0% by weight of an organic acid, wherein the pH of the composition is from 7 to 9.

In still yet another embodiment a composition is provided comprising: from about 5% to about 25% by weight of water; from about 10% to about 45% by weight of a water-miscible organic solvent selected from the group consisting of propylene glycol, glycerol, dimethylacetamide, tetrahydrofuryl alcohol, ethylene glycol, hexylene glycol, and mixtures thereof; from about 20% to about 30% by weight of at least one alkanolamine; from about 5% to about 15% by weight of HF; from about 0.5% to about 2% by weight of an organic acid is selected from the group consisting of l-ascorbic acid, oxalic acid, malonic acid, citric acid, acetic acid, imiodiacetic acid, lactic acid, para-toluene sulfonic acid, gallic acid, and mixtures thereof; from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the composition has a pH of from about 7 to about 9.

In yet another aspect, herein is provided a method for removing residue from a semiconductor substrate, the method comprising the steps of: contacting the semiconductor substrate with a cleaning composition as described herein, wherein the semiconductor substrate comprises a porous dielectric material having a dielectric constant; rinsing the cleaning composition from the semiconductor substrate; and drying the semiconductor substrate, wherein the dielectric constant of the porous dielectric material does not increase more than 0.50, wherein the residue comprises a cobalt residue.

DETAILED DESCRIPTION

The present invention provides a composition whose components are present in amounts that effectively remove residue from a substrate such as, for example, a semiconductor substrate. In applications concerning semiconductor substrates, such residues include, for example, photoresist residues, ash residues, and etch residues such as, for example, residues caused by reactive ion etching. Moreover, a semiconductor substrate also includes metal, silicon, silicate and/or inter-level dielectric material such as deposited silicon oxides, which will also come into contact with the cleaning composition. Typical metals include copper, copper alloy, titanium, titanium nitride, tantalum, tantalum nitride, aluminum and/or aluminum alloy. The cleaning composition of the present invention is compatible with such materials as they exhibit a low metal and/or dielectric etch rate. In particular, compositions providing a copper etch rate of 4 Ångstrom/minute (0.4 nanometer/minute) or less, 3 Ångstrom/minute (0.3 nanometer/minute) or less, or 2 Ångstrom/minute (0.2 nanometer/minute) or less may be preferred.

Water

The cleaning compositions of the present invention comprise water. In the present invention, water functions in various ways such as, for example, to dissolve one or more solid components of the composition, as a carrier of the components, as an aid in the removal of the residue, as a viscosity modifier of the composition, and as a diluent. Preferably, the water employed in the cleaning composition is de-ionized (DI) water.

It is believed that, for most applications, the cleaning composition will comprise, for example, from about 25 to about 80% by wt. of water. Other embodiments of the present invention could comprise about 35 to about 50% by wt. of water. Other preferred embodiments of the present invention could comprise from about 50 to about 80% by wt. of water.

Fluoride Ion

The cleaning composition of the present invention also comprises one or more sources of fluoride ion. Fluoride ion functions principally to assist in removing inorganic residues from the substrate.

Preferred compounds that provide a fluoride ion source according to the present invention include hydrogen fluoride (HF), ammonium fluoride ($NH_4F$), ammonium hydrogen difluoride ($NH_4HF_2$), ammonium fluoroborate ($NH_4BF_4$), boron trifluoride ($BF_3$), fluoroboric acid ($HBF_4$), hydrosilicofluoric acid ($H_2SiF_6$), and a quaternary ammonium fluoride such as, for example, tetramethylammonium fluoride and tetrabutylammonium fluoride. These can be used individually or in a mixture of two or more thereof.

A fluoride salt of an aliphatic primary, secondary or tertiary amine can also be employed as the fluoride ion source. Examples of such amines are those having the formula:

$$R^1NR^2R^3R^4F$$

wherein $R^1$, $R^2$, $R^3$ and $R^4$ individually represent H or a ($C_1$-$C_4$) alkyl group. Typically, the total number of carbon atoms in the $R^1$, $R^2$, $R^3$ and $R^4$ groups is 12 carbon atoms or less.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In a preferred embodiment, the fluoride ion source is hydrogen fluoride (HF).

It is believed that the amount of the compound used as the source of the fluoride ion in the cleaning composition will, for most applications, comprise, from about 0.01 to about 5% by weight (based on the active if, for example, in an aqueous solution). "Based on active" is intended to mean the percent by weight of fluoride ions contributed to the cleaning composition by the source of fluoride ion. For example, if the compound used as the source of the fluoride ion is HF as a 5% aqueous solution, then preferably the composition of the invention may comprise, for example, from about 3 to about 20% by weight, more preferably from about 5% to about 15% by weight and, more preferably, from about 10 to about 15% by weight of HF (5%) component. If, as another example, the compound used as the source of the fluoride ion is ammonium fluoride, then the composition of the invention may comprise from about 0.02 to about 15% by weight, more preferably from about 0.02 to about 10% by weight, still more preferably, about 1 to about 8% by weight, and most preferably, from about 0.025% to about 5% by weight of a solution of about 40% ammonium fluoride.

It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

$H_2SO_4$

The cleaning composition of the present invention also comprises sulfuric acid ($H_2SO_4$). The sulfuric acid functions principally to increase the etch rate of inorganic residues from the substrate such as cobalt residue that, otherwise, have proven difficult to remove in a timely manner and without harming the device. A source of the cobalt residue is, for example, a cobalt-containing barrier diffusion layer.

The composition of the invention may comprise from about 0.01 to about 10% by weight, more preferably from about 0.50 to about 8% by weight, still more preferably, about 1 to about 5% by weight of sulfuric acid.

pH/Buffer

The cleaning composition of the present invention preferably includes a buffering agent to control the pH of the composition, typically to within a range of from about 7 to about 9, with the preferred pH range being between from about 8 to about 9. The use of buffering is advantageous, indeed even quite important because some applications exhibit a pH drift which can cause significant and undesirable variances in cleaning and substrate etching.

Buffering agents for use in the present invention typically comprise a weak acid and a soluble salt containing the conjugate base of the weak acid. For example, the buffering agent can comprise a weak organic monoacid and its conjugate base such as, for example, acetic acid and ammonium acetate. In other embodiments, the buffering agent may comprise an organic or inorganic base in combination with an organic acid (preferably a diacid or a triacid). Examples of suitable bases include: ammonium hydroxide, amines, and quaternary ammonium hydroxides. In semiconductor applications, it is preferred that the base not include metal ions, for example, sodium and potassium, because they tend to contaminate the substrate. In some embodiments, the composition of this invention will be free of sodium and potassium. Preferred bases are the amine compounds described herein and the preferred acids are the organic acids described herein. The amine compound and the organic acid compound together function as a buffer when present in amounts sufficient to form a buffer (i.e., when the molar ratio of the acid to the base is from 1:1 to 1:10).

Amine Compound (Buffer)

Examples of amine compounds for use as a buffer component in certain preferred embodiments of the present invention, include the alkanolamines. Preferred alkanolamines include the lower alkanolamines which are primary, secondary and tertiary having from 1 to 5 carbon atoms. Examples of such alkanolamines include N-methylethanolamine (NMEA), monoethanolamine (MEA), diethanolamine, mono-, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of triethanolamine (TEA), diethanolamine, N-methyl diethanolamine, diisopropanolamine, monoethanol amine, amino (ethoxy) ethanol (AEE), N-methyl ethanol amine, monoisopropanol amine, cyclohexylaminediethanol, and mixtures thereof.

It is believed that the amount of the amine compound in the composition will, for the most applications, comprise from about 1% to about 50% by weight of the composition, specifically, about 8% to about 50% by weight of the composition, or more specifically, about 20% to about 50% by weight of the composition. In some embodiments, the amine compound comprises from about 2% to about 15% weight percent and, more specifically, from about 3 to about 12% or about from 3 to about from 7% by weight of the composition.

In addition to functioning as the base component of a buffer, any amine compound not reacted with an acid may also function to react with organic residue and chelate metals during the cleaning operation.

Organic Acid (Buffer)

The cleaning composition of the present invention also comprises one or more organic acid, which functions as a pH adjustor and, in some embodiments, as a buffer component.

Examples of organic acids may be aliphatic/aromatic carboxylic acids, amino carboxylic acid, sulfonic acids and aminosulfonic acid. Exemplary carboxylic acids include, but are not limited to, acetic acid, propionic acid, butyric acid, pentanoic acid, 3-methylbutanoic acid, hexanoic acid, heptanoic acid, octanoic acid, nonanoic acid, decanoic acid, dodecanoic acid, tridecanoic acid, tetradecanoic acid, pentadecanoic acid, hexadecanoic acid, heptadecanoic acid, octadecanoic acid, dodecanedioic acid, 2-methylheptanoic acid, 2-hexyldecanoic acid, oxalic acid, malonic acid, maleic acid, fumaric acid, succinic acid, itaconic acid, glutaric acid, adipic acid, malic acid, tartaric acid, acrylic acid, methacrylic acid, citric acid, lactic acid, glycolic acid, ascorbic acid, anthranilic acid, gallic acid, benzoic acid, isophthalic acid, phthalic acid, trimellitic acid, pyromellitic acid, salicylic acid, 2,4-dihydroxy benzoic acid and others. Exemplary amino carboxylic acids include, but are not limited to, glycine, dihydroxy ethyl glycine, alanine, valine, leucine, asparagine, glutamine, aspartic acid, glutaric acid, lysine, arginine, imino diacetic acid, nitrilo triacetic acid, ethylenediamine tetraacetic acid, 1,2-cyclohexadiamine tetraacetic acid, diethylene triamine pentaacetic acid, and others. Exemplary sulfonic/aminosulfonic acids include, but are not limited to, benzyl sulfonic acid, p-toluene sulfonic acid, 2-(N-morpholino)ethanesulfonic acid, N-(2-hydroxyethyl) piperazine-N'-(ethanesulfonic acid), 3-[N,N-bis(2-hydroxyethyl)amino]-2-hydroxypropanesulfonic acid, 4-(N-morpholino)butanesulfonic acid, N-(2-hydroxyethyl)piperazine-N'-(2-hydroxypropanesulfonic acid), N-(2-hydroxyethyl) piperazine-N'-(3-propanesulfonic acid), 2-(N-cyclohexylamino)ethanesulfonic acid, and mixtures thereof.

In preferred embodiments, the organic acid is selected from the group consisting of l-ascorbic acid, oxalic acid, malonic acid, citric acid, acetic acid, imiodiacetic acid, lactic acid, para-toluene sulfonic acid, gallic acid, and mixtures thereof. A more preferred organic acid is l-ascorbic acid.

It is believed that the amount of the organic acid in the composition will, for the most applications, comprise from about 1% to about 25% by weight or from about 1% to about 15% by weight of the composition. Preferably, the organic acid comprises from about 2% to about 12% weight percent, preferably from about 6 to about 10%, and, more preferably, from about 2 to about 5% by weight of the composition.

Water-Miscible Organic Solvent (Optional)

The cleaning composition of the present invention optionally comprises one or more water-miscible organic solvent (s). In certain embodiments of the present invention, metal lines on the substrate typically dictate whether a water-miscible organic solvent is used. For example, when aluminum lines are present on a substrate, the combination of water and fluoride ion will typically tend to etch the aluminum. In such embodiments, the use of a water-miscible organic solvent can significantly reduce, if not eliminate, etching of aluminum if present.

Examples of water-miscible organic solvents that can be used are ethylene glycol, propylene glycol, 1,4-butanediol, hexylene glycol, dimethylsulfoxide, dimethyl acetamide, tetrahydrofurfuryl alcohol, glycerol, alcohols, sulfoxides, or mixtures thereof.

Preferred water-miscible solvents include propylene glycol, glycerol, dimethyl acetamide, tetrahydrofuryl alcohol, ethylene glycol, hexylene glycol, and mixtures thereof. Dimethylacetamide, propylene glycol (PG), glycerol, or combinations thereof are most preferable.

It is believed that, for most applications, the amount of water-miscible organic solvent will comprise from about 10 to 90% by weight of the composition or from about 30 to 85% by weight of the composition. In some embodiments, the solvent comprises from about 50 to about 85% by weight and, most especially, from about 55% to about 80% by weight of water-miscible organic solvent by weight of the composition.

In embodiments where the water-miscible solvent is present, the amount of water in the composition may be significantly reduced to, for example, from about 5% to about 25% by weight.

In the composition of the present invention, the water-miscible organic solvent functions primarily to dissolve organic residues.

In some embodiments of the present invention, if employed, the water-miscible solvent component of the compositions of the present invention does not include an ether solvent. In other words, in such certain embodiments, ethers are not employed as the water-miscible solvent component of the compositions of the present invention. (The compositions are ether free compositions). Without wishing to be bound by theory, it is believed that in some embodiments ether solvents can damage the low-k layer. In particular, it is believed that ether solvents can penetrate the porous low-k dielectric layer making it difficult to remove from the low-k layer and increasing the dielectric constant. Thus, ether solvents can contaminate the porous low-k layer and adversely affect its insulation ability. In addition, ether solvents can adversely affect and increase the copper etch rate. Accordingly, upon use, the compositions of the present invention preferably do not increase the dielectric constant of the low-k dielectric layer more than 0.50 and the Cu etch rate does not exceed 4 Ångstrom/minute (0.4 nanometer/minute).

Corrosion Inhibitors

The compositions of the present invention optionally comprise at least one corrosion inhibitor. Corrosion inhibitors serve to react with the substrate surface being cleaned, which may be a metal, particularly copper, or a nonmetal, to passivate the surface and prevent excessive etching during cleaning. In particular and without being bound to any particular theory, it is believed that the corrosion inhibitor forms a coating of an insoluble chelate compound on the copper surface, thus suppressing contact between the photoresist residue removal component and the metal thereby preventing corrosion.

Any corrosion inhibitor known in the art for similar applications, such as those disclosed in U.S. Pat. No. 5,417,877, which are incorporated herein by reference, may be used. The use of a corrosion-inhibitor is particularly preferred when the composition is used to clean a metallic substrate. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, catechol, t-butyl catechol, L-ascorbic acid, gallic acid, vanillin, salicylic acid, diethyl hydroxylamine, and poly(ethyleneimine).

Preferred copper corrosion inhibitors are selected from the group consisting of benzotriazole, amino-benzotriazole, L-ascorbic acid, gallic acid, vanillin, diethylhydroxylamine, and mixtures thereof.

In other embodiments, the corrosion inhibitor is a triazole and is at least one of benzotriazole, o-tolyltriazole, m-tolyltriazole, and p-tolyltriazole.

It is believed that for most applications, the corrosion-inhibitor will comprise from about 0.1 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % of the composition.

Other Optional Ingredients

The cleaning composition of the present invention may also include one or more of the following additives: surfactants, chelating agents, chemical modifiers, dyes, biocides, and other additives. The additive(s) may be added to the extent that they do not adversely affect the pH range of the composition.

Another optional ingredient that can be used in the cleaning composition is a metal chelating agent; it can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that, for most applications, the chelating agent will be present in the composition in an amount of from about 0.1 wt. % to about 10 wt. %, preferably in an amount of from about 0.5 wt. % to about 5 wt. % of the composition.

Other commonly known components such as dyes, biocides etc. can be included in the cleaning composition in conventional amounts, for example, amounts up to a total of about 5 weight % of the composition.

In one exemplary embodiment, the cleaning composition of the present invention comprises from about 25% to about 80% by weight of water; from about 0.01% to about 5% by weight of a fluoride ion source, based on actives; from about 0.01% to about 10% by weight of sulfuric acid; from about 1% to about 50% by weight of an alkanolamine; from about 1% to about 25% by weight of an organic acid, wherein the pH of the composition is from 7 to 9.

In another exemplary embodiment, the cleaning composition of the present invention comprises: from about 50% to about 80% by weight of water; from about 9.5% to about 15% by weight of a source of fluoride ions, based on actives; from about 2.0% to about 8% by weight of sulfuric acid; from about 25% to about 30% by weight of an alkanolamine; from about 0.8% to about 2.0% by weight of an organic acid, wherein the pH of the composition is from 7 to 9.

In another exemplary embodiment, the cleaning composition of the present invention comprises: from about 50% to about 80% by weight of water; from about 20% to about 30% by weight of at least one alkanolamine; from about 5% to about 15% by weight of HF; from about 0.5% to about 2% by weight of L-ascorbic acid; and from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the pH of the composition is from 7 to 9.

In another exemplary embodiment, the cleaning composition of the present invention comprises: from about 50% to about 80% by weight of water; from about 9.5% to about 15% by weight of a source of fluoride ions, based on actives; from about 2.0% to about 8% by weight of sulfuric acid; from about 25% to about 30% by weight of an alkanolamine; from about 0.8% to about 2.0% by weight of an organic acid, wherein the pH of the composition is from 7 to 9.

In another exemplary embodiment, the cleaning composition of the present invention comprises: from about 5% to about 25% by weight of water; from about 10% to about 45% by weight of a water-miscible organic solvent selected from the group consisting of propylene glycol, glycerol, dimethylacetamide, tetrahydrofuryl alcohol, ethylene glycol, hexylene glycol, and mixtures thereof; from about 20% to about 30% by weight of at least one alkanolamine; from about 5% to about 15% by weight of HF; from about 0.5% to about 2% by weight of an organic acid is selected from the group consisting of l-ascorbic acid, oxalic acid, malonic acid, citric acid, acetic acid, imiodiacetic acid, lactic acid, para-toluene sulfonic acid, gallic acid, and mixtures thereof;

from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the composition has a pH of from about 7 to about 9.

When exposed to a substrate comprising a porous dielectric material, the cleaning compositions of the present invention do not substantially change the dielectric constant of the porous dielectric material. In this regard, when exposed to a substrate comprising a porous dielectric material, the cleaning compositions of the present invention preferably does not increase the material's dielectric constant by more than 0.35 and, preferably, not more than 0.25.

The cleaning composition of the present invention is typically prepared by mixing the components together in a vessel at room temperature until all solids have dissolved in the aqueous-based medium.

The cleaning composition of the present invention can be used to remove from a substrate undesired residue, including residue that comprises cobalt. It is believed that the composition can be used to particularly good advantage in cleaning a semiconductor substrate on which residue is deposited or formed during the process for manufacturing semiconductor devices; examples of such residue include resist compositions in the form of films (both positive and negative) and etching deposits formed during dry etching, as well as chemically degraded resist films. The use of the composition is particularly effective when the residue to be removed is a resist film and/or an etching deposit on a semiconductor substrate having a metal film-exposed surface. Examples of substrates that can be cleaned by use of the composition of the present invention without attacking the substrates themselves include metal substrates, for example: aluminum titanium/tungsten; aluminum/silicon; aluminum/silicon/copper; silicon oxide; silicon nitride; and gallium/arsenide. Such substrates typically include residues comprising photoresists and/or post etch deposits.

In addition to being effective when used to remove resist films and/or etching residues on a semiconductor wafer having an exposed surface of a metal film, the cleaning composition is especially effective when the metal film is made of copper or a copper alloy containing copper as the main component and also when a low-dielectric film is used as an interlayer insulating film. An example of a copper alloy containing copper as the main component is one containing 90% by weight or more copper, and other elements, for example, Sn, Ag, Mg, Ni, Co, Ti, Si, and Al. Since these metals have low resistances and improve the high-speed operation of elements, but are easily dissolved or corroded by chemicals, the "non-corrosive" properties of the composition of the present invention are significant.

The cleaning composition can be used to remove post-etch and ash, other organic and inorganic residues as well as polymeric residues from semiconductor substrates at relatively low temperatures with little corrosive effect. The cleaning composition of the invention is particularly effective in removing cobalt containing etch residue. The cleaning composition should be applied to the surface for a period of time sufficient to obtain the desired cleaning effect. The time will vary depending on numerous factors, including, for example, the nature of the residue the temperature of the cleaning composition and the particular cleaning composition used. In general, the cleaning composition can be used, for example, by contacting the substrate at a temperature of from about 25 degrees C. to about 85 degrees C. for a period of time ranging from about 1 minute to about 1 hour followed by rinsing the cleaning composition from the substrate and drying the substrate.

The contacting step can be carried out by any suitable means such as, for example, immersion, spray, or via a single wafer process; any method that utilizes a liquid for removal of photoresist, ash or etch deposits and/or contaminants can be used.

The rinsing step is carried out by any suitable means, for example, rinsing the substrate with de-ionized water by immersion or spray techniques. In some embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centrifugal force.

It will be appreciated by those skilled in the art that the cleaning composition of the present invention may be modified to achieve optimum cleaning without damaging the substrate so that high throughput cleaning can be maintained in the manufacturing process. For example, one skilled in the art would appreciate that, for example, modifications to the amounts of some or all of the components may be made depending upon the composition of the substrate being cleaned, the nature of the residue to be removed, and the particular process parameters used.

In another embodiment of the present invention is provided a replenishment composition for the cleaning composition of this invention. As the cleaning composition is used to clean semiconductor substrates the cleaning composition is partially removed from the container or bath that holds the cleaning composition with each of the substrates that are contacted with the cleaning composition. The cleaning composition is typically used to clean a plurality of substrates that are serially and/or simultaneously and/or both serially and simultaneously (in the case of batches of substrates that contacted with the cleaning composition followed by one or a plurality of batches) and then replaced with a fresh quantity of the cleaning composition. The substrates are contacted with the cleaning composition by, for example, spraying the one or more substrates with the cleaning composition and/or dipping the one or more substrates into a bath containing the cleaning composition. The tool used to clean the substrates may be for example, a spray solvent tool, a wet bench tool or a single wafer tool. Additionally, typically the method further comprises the step of heating the cleaning composition ambient temperature to, for example, a temperature between from about 25 to 85 degrees C. or from about 25 to about 45 degrees C. prior to and/or when contacting the one or more substrates. The heating of the cleaning composition causes the components of the cleaning composition to evaporate. The rate of the evaporation of each of the components is typically a function of the boiling points of each of the components thereby causing the ratio of the components in the cleaning composition to change over time. It has been determined for the cleaning compositions of this invention that it may be beneficial to add a replenishment composition to the cleaning composition after it has cleaned a set number of substrates or after a certain period of time or upon measurement of a variable characteristic of the cleaning composition that is related to the change in the ratio of the components in the cleaning composition. Examples of the variables that may be measured and used to determine if it is time to add the replenishment composition to the cleaning composition include:

the pH or cleaning efficiency or substrate etch rates of the composition or the level of the cleaning composition in the bath.

The method may further comprise the steps of rinsing the cleaning composition from the semiconductor substrate; and drying the semiconductor substrate, wherein the semiconductor substrate comprises a porous dielectric material having a dielectric constant; and wherein after said contacting, rinsing and drying steps the dielectric constant of the porous dielectric material does not increase more than 0.50, or does not increase more than 0.25.

The preferred components used to form the cleaning compositions are the same preferred components for use in the replenishment composition as described above for the cleaning composition. The replenishment compositions will comprise the same components, although typically fewer components than the cleaning composition to which it is added and typically the ratios for the components in the cleaning composition will differ from the ratios of the components in the replenishment composition. The exact preferred components and the ratios of the components in the replenishment composition will be a function of the rate of loss of each particular component either by its removal with the substrate (e.g. from the bath) upon completion of the contacting step or due to its evaporation from the composition relative to the other components' evaporation.

In one embodiment, the replenishment composition is added to the cleaning composition by periodic addition to the bath, for example, via a nozzle. A level sensor may be used to determine how much replenishment composition to add to the bath. The replenishment composition may be added after each substrate or after each batch of a plurality of substrates are cleaned by contacting them with the cleaning composition. However, after a set number of substrates have been treated, by the cleaning composition, the entire bath may require that the cleaning composition be discarded and replaced with fresh cleaning composition, and the process of contacting and adding can be repeated. The intervals for adding the replenishment composition to the cleaning composition and replacing the entire cleaning composition will vary depending upon the temperature of the cleaning composition, the substrates to be cleaned, and the residues and can be determined by a person of skill in the art. Although the present invention has been principally described in connection with cleaning semiconductor substrates, the cleaning compositions of the invention can be employed to clean any substrate that includes organic and inorganic residues.

EXAMPLES

The following examples are provided for the purpose of further illustrating the present invention but are by no means intended to limit the same.

General Procedure for Preparing the Cleaning Compositions

All compositions which are the subject of the present Examples were prepared by mixing 100 g of material in a 150 mL beaker with a 1 inch (2.5 centimeter) Teflon-coated stir bar. The compositions are listed in the Tables below.

Compositions of the Substrate:

Each substrate used in the present Examples comprised a metal layer for etch rate evaluation (copper or cobalt) on crystalline silicon wafer, The wafer coupon was cut out from a whole wafer into about 1 inch (2.5 centimeter)×1 inch (2.5 centimeter) size and initial thickness of metal layer was measured using Resmap four point probe (Creative Design Engineering, Inc., Cupertino, Calif., USA).

Processing Conditions:

Cleaning tests were run using about 100 mL of the cleaning compositions in a 150 mL beaker with a 1 inch (2.5 centimeter) round Teflon stir bar set at 500 revolutions per minute. The cleaning compositions were heated to the desired temperature indicated below on a hot plate if necessary. Wafer segments approximately 1 inch (2.5 centimeter)×1 inch (2.5 centimeter) in size were immersed in the compositions under the following set of conditions: 0, 15 and 60 minutes at 35 degrees C.

The segments were then rinsed for 3 minutes in a DI water overflow bath and subsequently dried using filtered nitrogen. They were then analyzed for thickness change using Resmap four point probe (Creative Design Engineering, Inc., Cupertino, Calif., USA).

Etch Rate Measurement Procedure

Coupons of the blanket Cu or blanket Co wafers were measured for metal layer thickness by measuring the resistivity of the layer by employing a ResMap™ model 273 resistivity instrument from Creative Design Engineering, Inc. The coupons were then immersed in the composition at the desired temperature for up to one hour. Periodically the coupons were removed from the composition, rinsed with de-ionized water and dried and the thickness of the metal layer was again measured. A graph of the change in thickness as a function of immersion time was made (not shown) and the etch rate in Angstroms/min was determined from the slope of the curve.

Film Loss Measurement Procedures

1. Measure the thickness before chemical immersion.
2. Immersion test was carried out in beaker with magnetic stir agitation (500 revolutions per minute) at 35 degrees C. for 15 or 60 minutes.
3. Chemical immersion was followed by 3 minutes DI rinse and $N_2$ blow dry.
4. Measure the thickness after chemical immersion.
5. Etch Rate=(Step 1-Step 4)/Immersion time FIGS. 1a and 1b identify the components of the compositions tested, the mass of each component, and the film loss rate.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The use of open terms, for examples "comprising" and "having" herein include the more restrictive "consisting of" and "consisting essentially of" as if they were explicitly set forth everywhere the open terms appear.

What is claimed is:

1. A composition useful for removing residue from a semiconductor substrate, the composition comprising: from about 25% to about 80% by weight of water; from about 0.01% to about 5% by weight of a fluoride ion source, based on actives; from about 0.01% to about 10% by weight of sulfuric acid; from about 1% to about 50% by weight of an alkanolamine; from about 1% to about 25% by weight of an organic acid, from about 0.1% to about 15% by weight of a corrosion inhibitor selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the pH of the composition is from 7 to 9.

2. A composition useful for removing residue from a semiconductor substrate, the composition comprising: from about 25% to about 80% by weight of water; from about 0.01% to about 5% by weight of a source of fluoride ions, based on actives; from about 0.01% to about 10% by weight of sulfuric acid; from about 1% to about 50% by weight of an alkanolamine; from about 1% to about 25% by weight of an organic acid; and a water-miscible organic solvent.

3. The composition of claim 2 further comprising from about 0.1% to about 15% by weight of a corrosion inhibitor selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

4. The composition of claim 2, wherein said water-miscible organic solvent is selected from the group consisting of propylene glycol, glycerol, dimethylacetamide, tetrahydrofuryl alcohol, ethylene glycol, hexylene glycol, and mixtures thereof.

5. The composition of claim 1 wherein the fluoride ion source is selected from the group consisting of hydrogen fluoride (HF), ammonium fluoride ($NH_4F$), ammonium hydrogen difluoride ($NH_4HF_2$), ammonium fluoroborate ($NH_4BF_4$), boron trifluoride ($BF_3$), fluoroboric acid ($HBF_4$), hydrosilicofluoric acid ($H_2SiF_6$), and a quaternary ammonium fluoride.

6. The composition of claim 5 wherein the fluoride ion source is ammonium fluoride.

7. The composition of claim 5 wherein the fluoride ion source is HF.

8. The composition of claim 5 wherein the fluoride ion source is a quaternary ammonium compound selected from the group consisting of tetramethylammonium fluoride and tetrabutylammonium fluoride.

9. The composition of claim 1 wherein the organic acid is selected from the group consisting of l-ascorbic acid, oxalic acid, malonic acid, citric acid, acetic acid, imiodiacetic acid, lactic acid, para-toluene sulfonic acid, gallic acid, and mixtures thereof.

10. A composition comprising: from about 5% to about 25% by weight of water; from about 10% to about 45% by weight of a water-miscible organic solvent selected from the group consisting of propylene glycol, glycerol, dimethylacetamide, tetrahydrofuryl alcohol, ethylene glycol, hexylene glycol, and mixtures thereof; from about 20% to about 30% by weight of at least one alkanolamine; from about 5% to about 15% by weight of HF (5% aqueous solution; from about 0.5% to about 2% by weight of an organic acid is selected from the group consisting of l-ascorbic acid, oxalic acid, malonic acid, citric acid, acetic acid, imiodiacetic acid, lactic acid, para-toluene sulfonic acid, gallic acid, and mixtures thereof; from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the composition has a pH of from about 7 to about 9.

11. The composition of claim 1 wherein the organic acid is l-ascorbic acid.

12. A composition comprising: from about 50% to about 73% by weight of water; from about 20% to about 30% by weight of at least one alkanolamine; from about 5% to about 15% by weight of HF (5% aqueous solution; from about 0.5% to about 2% by weight of L-ascorbic acid; and from about 1.5% to about 8% by weight of sulfuric acid; and about 0.1% of a triazole selected from the group consisting of benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, wherein the composition has a pH of from about 7 to about 9.

13. The composition of claim 3 wherein the triazole is at least one of benzotriazole, o-tolyltriazole, m-tolyltriazole, and p-tolyltriazole.

14. The composition of claim 1 wherein the alkanolamine is selected from the group consisting of N-methylethanolamine (NMEA), monoethanolamine (MEA), diethanolamine, mono-, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

15. The composition of claim 14 wherein the alkanolamine is monoethanolamine.

16. The composition of claim 14 wherein the alkonolamine is triethanolamine.

17. The composition of claim 4 wherein the water-miscible organic solvent is dimethylacetamide.

18. The composition of claim 4 wherein the water-miscible organic solvent is propylene glycol.

19. The composition of claim 4 wherein the water-miscible organic solvent is glycerol.

20. A method for removing residue from a semiconductor substrate, the method comprising the steps of: contacting the semiconductor substrate with a cleaning composition according to claim 1, wherein the semiconductor substrate comprises a porous dielectric material having a dielectric constant; rinsing the cleaning composition from the semiconductor substrate; and drying the semiconductor substrate, wherein the dielectric constant of the porous dielectric material does not increase more than 0.50, wherein the residue comprises a cobalt residue.

21. The method claim 20 wherein the cleaning composition provides a copper etch rate of 4 Å/min or less.

* * * * *